United States Patent
Yang et al.

(10) Patent No.: US 8,982,609 B2
(45) Date of Patent: Mar. 17, 2015

(54) MEMORY HAVING READ ASSIST DEVICE AND METHOD OF OPERATING THE SAME

(75) Inventors: Jung-Ping Yang, Jui-bei (TW); Hong-Chen Cheng, Hsinchu (TW); Chih-Chieh Chiu, Toufen Township (TW); Chia-En Huang, Xinfeng Township (TW); Cheng Hung Lee, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 388 days.

(21) Appl. No.: 13/372,099

(22) Filed: Feb. 13, 2012

(65) Prior Publication Data
US 2013/0208533 A1 Aug. 15, 2013

(51) Int. Cl.
*G11C 11/00* (2006.01)

(52) U.S. Cl.
USPC ............ 365/154; 365/189.11; 365/189.15; 365/189.18; 365/203; 365/210.13

(58) Field of Classification Search
CPC ............. G11C 11/40; G11C 7/00; G11C 7/12
USPC .......... 365/154, 189.11, 189.15, 189.08, 203, 365/210.13
See application file for complete search history.

(56) References Cited

U.S. PATENT DOCUMENTS

| | | | |
|---|---|---|---|
| 7,881,137 B2 * | 2/2011 | Chen et al. | 365/203 |
| 8,526,256 B2 * | 9/2013 | Ghosh et al. | 365/203 |
| 2009/0154278 A1 * | 6/2009 | Chan-Choi et al. | 365/222 |
| 2012/0106269 A1 * | 5/2012 | Lee et al. | 365/189.09 |

* cited by examiner

*Primary Examiner* — Toan Le
(74) *Attorney, Agent, or Firm* — Lowe Hauptman & Ham, LLP

(57) ABSTRACT

A memory includes a first bit line, a memory cell coupled to the first bit line, and a read assist device coupled to the first bit line. The read assist device is configured to pull a first voltage on the first bit line toward a predetermined voltage in response to a first datum being read out from the memory cell. The read assist device includes a first circuit configured to establish a first current path between the first bit line and a node of the predetermined voltage during a first stage. The read assist device further includes a second circuit configured to establish a second current path between the first bit line and the node of the predetermined voltage during a second, subsequent stage.

20 Claims, 9 Drawing Sheets

US 8,982,609 B2

MEMORY HAVING READ ASSIST DEVICE AND METHOD OF OPERATING THE SAME

CROSS-REFERENCE TO RELATED APPLICATION

The present application relates to U.S. patent application Ser. No. 12/913,087, filed on Oct. 27, 2010, which is incorporated herein by reference in its entirety.

BACKGROUND

Besides processors, memories are main parts of computing systems and electronic devices. The performance of a memory, such as capacity, access speed, power consumption etc. impacts the overall performance of the system or electronic device. Developments are constantly sought to improve performance of memories.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
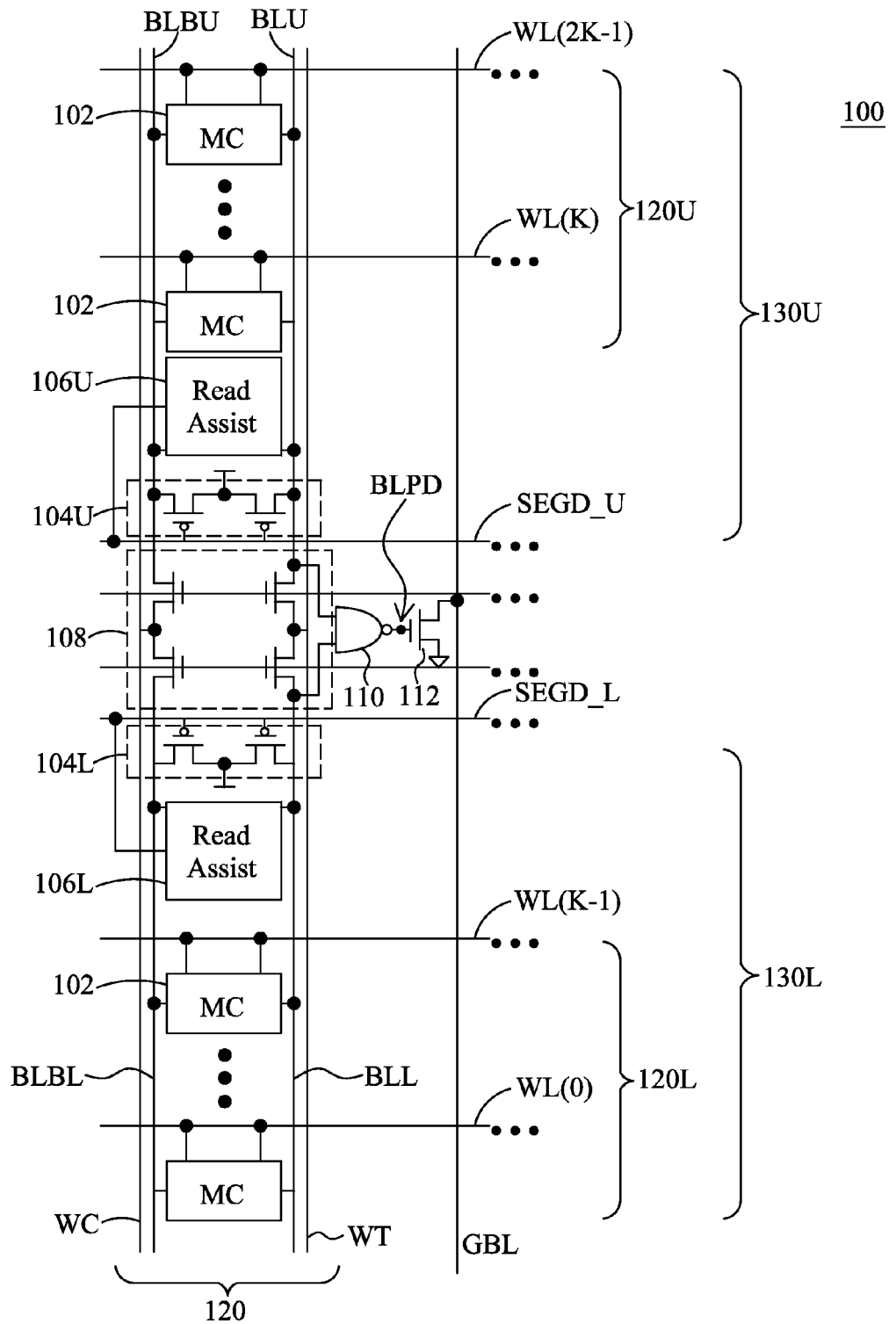
FIG. 1 is a schematic circuit diagram of a segment of a memory in accordance with some embodiments.

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

The drawings are not drawn to scale, and include certain features that are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a schematic circuit diagram of a segment of a memory 100 in accordance with some embodiments. The memory 100 includes one or more memory cells 102, one or more pairs of bit lines BLU/BLBU, BLL/BLBL, and one or more global bit lines GBL. One or more memory cells 102 are coupled to each pair of bit lines to form one or more memory blocks. Specifically, multiple memory cells 102 are coupled to the pair of bit lines BLU and BLBU to form an upper half 120U of a memory block 120, whereas multiple memory cells 102 are coupled to the pair of bit lines BLL and BLBL to form a lower half 120L of the memory block 120. One or more memory blocks is coupled to a global bit line. Specifically, the memory block 120 is coupled to the global bit line GBL. The memory 100 further includes a plurality of word lines WL(0)-WL(2k−1) (where k is an integer) coupled to the memory cells 102. The memory 100 has a lower half 130L and an upper half 130U. In the lower half 130L, the memory cells 102 are coupled to one half of the word lines, i.e., the word lines WL(0)-WL(k−1). In the upper half 130U, the memory cells 102 are coupled to the other half of the word lines, i.e., the word lines WL(k)-WL(2k−1). In FIG. 1, WT and WC denote pairs of write data lines.

Each memory block 120 includes bit line pre-charging circuits 104L, 104U, and read assist devices 106L, 106U in the corresponding lower and upper halves 130L, 130U of the memory 100. The memory block 120 further includes a write pass gate circuit 108, a sensing amplifier 110, and a pull-down circuit 112 all of which are common for both the lower and upper halves. The sensing amplifier 110 is connected to the bit lines BLU and BLL to detect a state of the bit lines BLU and BLL in a single-ended sensing scheme (i.e., one bit line BLU, rather than both bit lines BLU/BLBU, is used for the sensing operation). In some embodiments, a dual-rail sensing scheme is used where the sensing amplifier 110 uses both bit lines, e.g., BLU/BLBU, for the sensing operation.

In this example, the sensing amplifier 110 is implemented as a NAND gate, although other configurations are also within the scope of this disclosure. The bit line pre-charging circuits 104L, 104U are similarly configured and each include two p-channel metal-oxide semiconductor (PMOS) transistors. The read assist devices 106L, 106U are similarly configured. The memory block 120 in particular and the memory 100 in general have a symmetrical structure. In some embodiments, the memory 100 does not necessarily have a symmetrical structure. For example in some embodiments, the upper half of the memory 100, including the word lines WL(k)-WL(2k−1), the associated memory cells 102, the bit line pre-charging circuit 104U and the read assist device 106U, is omitted.

For read and/or write operations, the bit line pre-charging circuits 104L, 104U are arranged to pre-charge the corresponding bit lines BLU, BLL, and the read assist devices 106L, 106U are arranged to pull the pre-charged bit lines toward a predetermined voltage. The write pass gate circuit 108 is arranged to enable or disable writing to the memory cells 102 in the memory block 120. In some embodiments, when a logical "0" is read from a memory cell 102 in the memory block 120, the corresponding bit line (e.g., BLU) is pulled down to a ground voltage VSS, the sensing amplifier 110 outputs, at a node BLPD, a high voltage to the pull-down circuit 112 which, in turn, is opened to pull the global bit line GBL to the ground voltage. When a logical "1" is read from a memory cell 102 in the memory block 120, the corresponding bit line (e.g., BLU) is pulled up to a power supply voltage VDD, the sensing amplifier 110 outputs, at the node BLPD, a low voltage to the pull-down circuit 112 which, in turn, is closed and leaves the global bit line GBL at a global bit line pre-charge voltage.

The memory access speed depends on several factors, including how fast the read assist devices 106L, 106U pull the voltages on the corresponding bit lines to a predetermined voltage, e.g., the ground voltage. Circuitry for read assist devices and memories using such devices in accordance with some embodiments is described below.

In some embodiments, the operation of a read assist device in a memory includes first and second stages during which corresponding first and second current paths are established between a bit line and a node of a predetermined voltage. The first current path increases a transition speed of a voltage on the bit line toward the predetermined voltage during the first stage. The second current path further increases the transition speed during the second stage. As a result, the transition time is shortened and the access speed of the memory is increased.

Figure 2A:
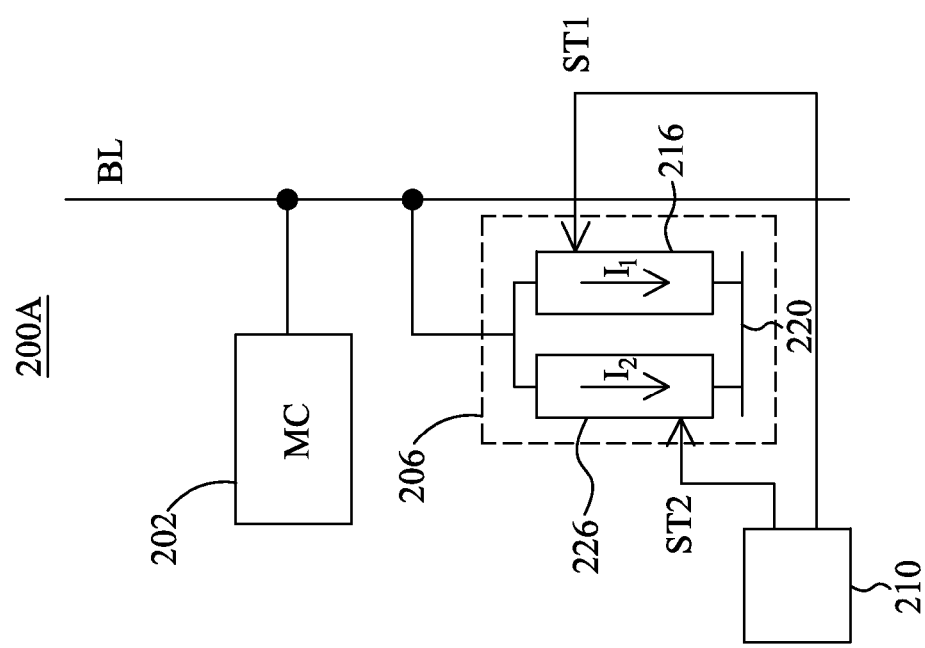
FIG. 2A is a schematic block diagram of a memory in accordance with some embodiments.

FIG. 2A is a schematic block diagram of a memory 200A in accordance with some embodiments. The memory 200A includes a bit line BL, a memory cell 202 coupled to the bit line BL, a read assist device 206, and a control circuit 210. The read assist device 206 is coupled to the bit line BL and is configured to pull a voltage on the bit line BL toward a predetermined voltage Vp of a node 220 in response to a datum being read out from the memory cell 202. In some embodiments, the predetermined voltage is the ground voltage VSS in a pull-down arrangement in which the voltage of the bit line BL is pulled down to the ground. In some embodiments, the predetermined voltage is a power supply voltage VDD in a pull-up arrangement in which the voltage of the bit line BL is pulled up to power supply voltage VDD. In some embodiments, the predetermined voltage is a voltage between the ground voltage VSS and the power supply voltage VDD or another voltage level depending on applications and/or other considerations.

The read assist device 206 includes a first circuit 216 and a second circuit 226. The first circuit 216 is configured to establish a first current path I1 between the bit line BL and the node 220 during a first stage, and the second circuit 226 is configured to establish a second current path I2 between the bit line BL and the node 220 during a second, subsequent stage. When the first current path I1 is established, a current flows along the first current path I1 between the bit line BL and the node 220. Accordingly, the voltage on the bit line BL is pulled toward the predetermined voltage Vp of the node 220 faster than when no current paths are established. Subsequently, the second current path I2 is established, and the current flows along both the first current path I1 and second current path I2, which are parallel with each other, thereby pulling the voltage on the bit line BL toward the predetermined voltage Vp faster than when only the first current path I1 is established. As a result, the transition speed of the voltage on the bit line toward the predetermined voltage Vp is increased which, in turn, increases the access speed.

The first circuit 216 is enabled by a first stage enabling signal ST1 to establish the first current path I1, and the second circuit 226 is enabled by a second stage enabling signal ST2 to establish the second current path I2. The first stage enabling signal ST1 and second stage enabling signal ST2 are supplied from the control circuit 210 to the corresponding first circuit 216 and second circuit 226. The first stage enabling signal ST1 is supplied first to the first circuit 216 during the first stage, and then the second stage enabling signal ST2 is supplied to the second circuit 226 during the second stage. In some embodiments, the first stage enabling signal ST1 is maintained during the whole second stage to maintain both the first current path I1 and the second current path I2 during the whole second stage. In some embodiments, the first stage enabling signal ST1 is maintained at the beginning of the second stage and then discontinued toward the end of the second stage. The reason is that the presence of multiple current paths provides a higher transition speed increasing effect at the beginning of the transition, than at the end. Power consumption is reduced by discontinuing the first stage enabling signal ST1 when the presence of the first current path I1 (in addition to the second current path I2) has become less effective.

In some embodiments, the control circuit 210 provides the second stage enabling signal ST2 by delaying the first stage enabling signal ST1. For this purpose, the control circuit 210 includes a delay circuit, for example, as disclosed in U.S. patent application Ser. No. 12/913,087, filed on Oct. 27, 2010 which is incorporated herein by reference in its entirety.

Figure 2B:
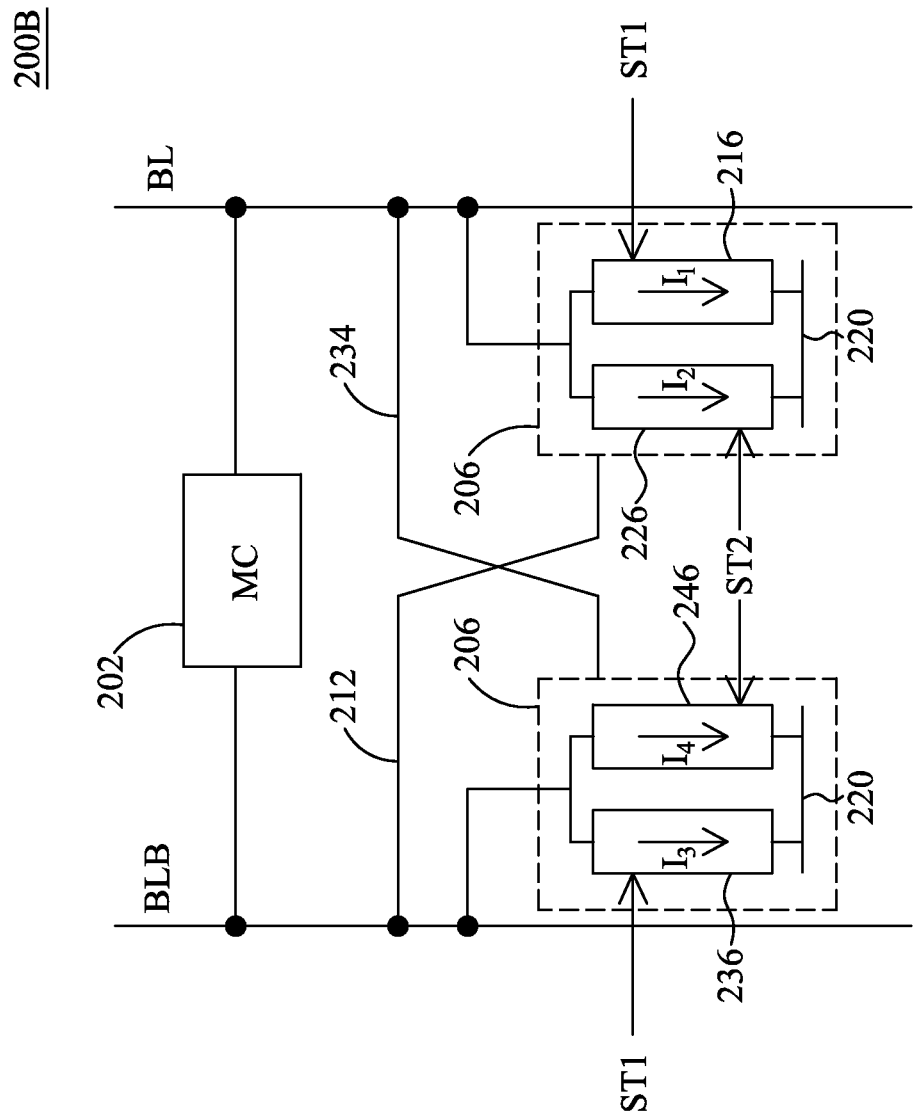
FIG. 2B is a schematic circuit diagram of a memory in accordance with some embodiments.

FIG. 2B is a schematic circuit diagram of a memory 200B in accordance with some embodiments. Similar to the memory 200A, the memory 200B includes the bit line BL, the memory cell 202 coupled to the bit line BL, the read assist device 206, and the control circuit 210 (which is not illustrated in FIG. 2B for simplicity). The memory 200B further includes a bit line bar BLB which defines together with the bit line BL a pair of bit lines. The memory cell 202 is coupled to the pair of bit lines.

The read assist device 206 further includes, in addition to the first circuit 216 and second circuit 226, a third circuit 236 and a fourth circuit 246. The third circuit 236 and fourth circuit 246 are coupled to pull a voltage on the bit line bar BLB toward the predetermined voltage Vp in response to a second datum being read out from the memory cell 202. The third circuit 236 is configured to establish a third current path I3 between the bit line bar BLB and the node 220 during the first stage, upon application of the first stage enabling signal ST1 from the control circuit 210 to the third circuit 236. The fourth circuit 246 is configured to establish a fourth current path I4 between the bit line bar BLB and the node 220 during the second stage, upon application of the second stage enabling signal ST2 from the control circuit 210 to the fourth circuit 246. The third current path I3 and fourth current path I4 increase the transition speed of the voltage on the bit line bar BLB toward the predetermined voltage Vp in a manner similar to the first current path I1 and second current path I2 increasing the transition speed of the voltage on the bit line BL toward the predetermined voltage Vp.

Unlike the first circuit 216 and third circuit 236 which are configured to pull the voltage on the bit line BL toward the predetermined voltage Vp in response to a first datum being read out from the memory cell 202, the third circuit 236 and fourth circuit 246 are configured to pull the voltage on the bit line bar BLB toward the predetermined voltage Vp in response to a second datum being read out from the memory cell 202. For example, when the first datum, e.g., a logic "0," is read out from the memory cell 202, the third circuit 236 and fourth circuit 246 are disabled by a voltage supplied from the bit line BL via a cross-coupling connection 234, and the first circuit 216 and second circuit 226 are enabled by a voltage supplied from the bit line BL via a cross-coupling connection 212. As a result, the voltage on the bit line BL is pulled toward the predetermined voltage Vp, e.g., the ground voltage VSS, by the first current path I1 and second current path I2. When the second datum, e.g., a logic "1," is read out from the memory cell 202, the first circuit 216 and the second circuit 226 are disabled whereas the third circuit 236 and the fourth circuit 246 are enabled. As a result, the voltage on the bit line bar BLB is pulled toward the predetermined voltage Vp, e.g., the ground voltage VSS, by the third current path I3 and fourth current path I4. An effect similar to that of the memory 200A is therefore achieved in the memory 200B.

Figure 3:
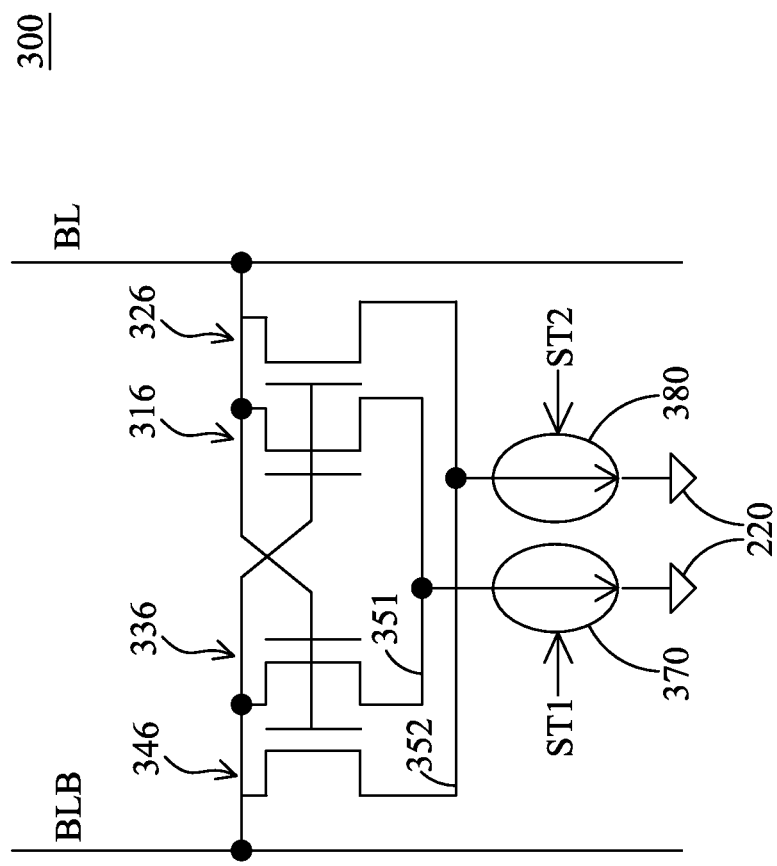
FIG. 3 is a schematic circuit diagram of a read assist device for a memory in accordance with some embodiments.

FIG. 3 is a schematic circuit diagram of a read assist device 300 for a memory in accordance with some embodiments. In the read assist device 300, first through fourth switches 316, 326, 336, 346 perform the functions of the corresponding first through fourth circuits 216, 226, 236, 246 in the memory 200B, i.e., to establish the corresponding first through fourth current paths I1, I2, I3, I4. Any suitable configuration for a switch is usable for each of the first through fourth switches 316, 326, 336, 346. In some embodiments, the circuitry is simplified in order to maximize the operating speed and minimize power consumption, by implementing one or more of the first through fourth switches 316, 326, 336, 346 as a single transistor, e.g., an n-channel metal-oxide semiconductor (NMOS) transistor or a p-channel metal-oxide semiconductor (PMOS) transistor.

The first and third switches 316, 336 together define a first input stage for the read assist device 300. The second and fourth switches 326, 346 together define a second input stage for the read assist device 300. Besides the first and second input stages, the read assist device 300 further includes first and second output stages defined by corresponding first and second current sources 370, 380. Any suitable configuration for a current source is usable for each of the first and second current sources 370, 380. In some embodiments, the circuitry is simplified in order to maximize the operating speed and minimize power consumption, by implementing one or both of the first and second current sources 370, 380 as a single transistor, e.g., an NMOS transistor or a PMOS transistor.

The first and third switches 316, 336, which together define the first input stage, are commonly connected to a first intermediate node 651 which is then connected to the node 220 via the first current source 370. The second and fourth switches 326, 346, which together define the second input stage, are commonly connected to a second intermediate node 352 which is then connected to the node 220 via the second current source 380. The first current source 370 commonly coupling the first and third switches 316, 336 to the node 220 of the predetermined voltage Vp is enabled during the first stage, by the first stage enabling signal ST1 supplied from a control circuit, e.g., the control circuit 210. When the first current source 370 is enabled, a current flows from the bit line BL or the bit line bar BLB (depending on whether a logical "0" or a logical "1" is read from a memory cell coupled to the pair of bit lines), through the corresponding first switch 316 or third switch 336, to the first current source 370 and then to the node 220. The voltage transition speed on the corresponding bit line BL or the bit line bar BLB is thus increased.

The second current source 380 commonly coupling the second and fourth switches 326, 346 to the node 220 of the predetermined voltage Vp is enabled during the second stage, by the second stage enabling signal ST2 supplied from the control circuit 210. When the second current source 380 is enabled, an additional current flows from the bit line BL or the bit line bar BLB (depending on whether a logical "0" or a logical "1" is read from the memory cell coupled to the pair of bit lines), through the corresponding second switch 326 or fourth switch 346, to the second current source 380 and then to the node 220. The voltage transition speed on the corresponding bit line BL or the bit line bar BLB is thus increased further. In some embodiments, the first current source 370 is enabled during both the first and second stages.

In some embodiments, the first through fourth switches 316, 326, 336, 346 are all commonly connected to an intermediate node (e.g., 351). The first and second current sources 370, 380 are coupled in parallel between the common intermediate node 351 and the node 220 having the predetermined voltage Vp.

In some embodiments, a single current source (e.g., 370) is coupled between the first through fourth switches 316, 326, 336, 346 and the node 220. The second stage enabling signal ST2 is supplied to enable the second and fourth switches 326, 346 and/or the first stage enabling signal ST1 is supplied to enable the first and third switches 316, 336. The single current source 370 is enabled during both the first and second stages.

Figure 4:
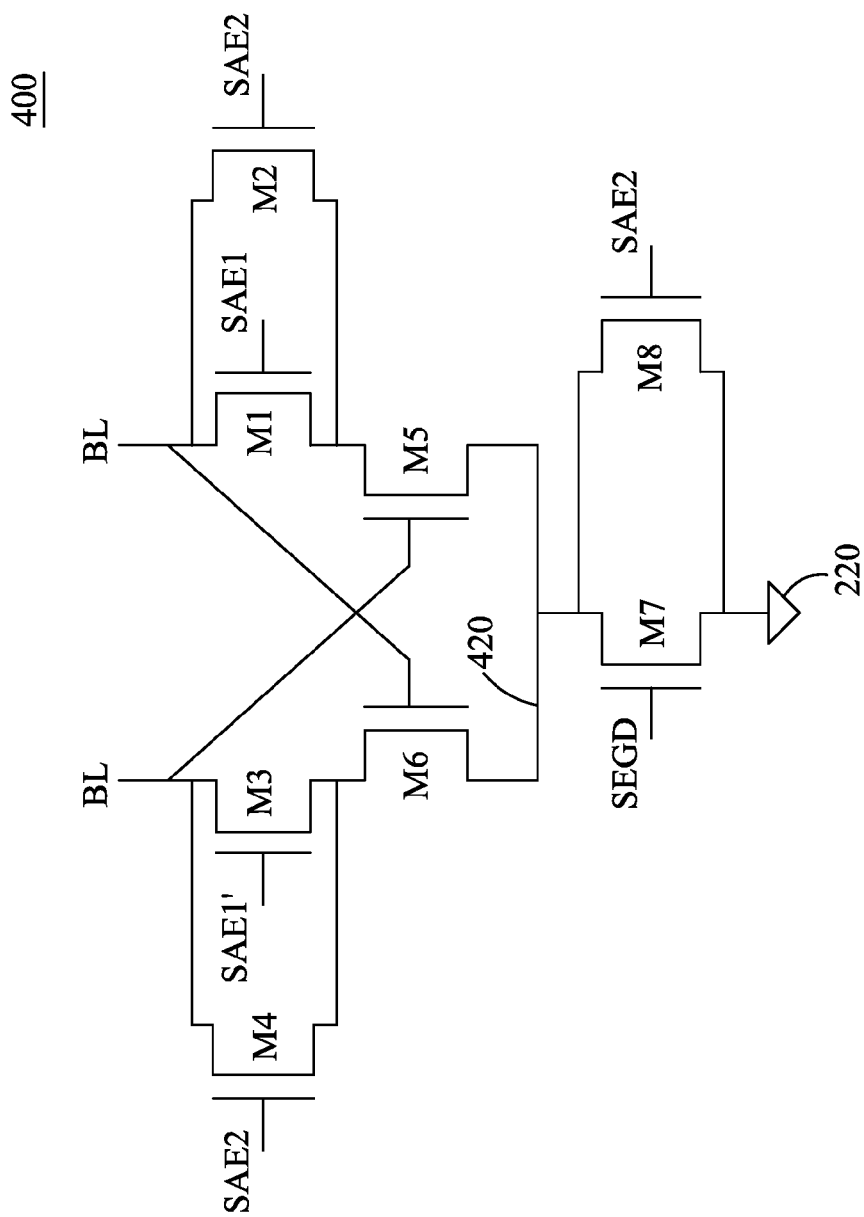
FIG. 4 is a schematic circuit diagram of a read assist device for a memory in accordance with some embodiments.

FIG. 4 is a schematic circuit diagram of a read assist device 400 for a memory in accordance with some embodiments. The read assist device 400 includes first through sixth transistors M1-M6. The first and fifth transistors M1, M5 are coupled in series between the bit line BL and the node 220. The first and second transistors M1, M2 are coupled in parallel. The third and sixth transistors M3, M6 are coupled in series between the bit line bar BLB and the node 220. The third and fourth transistors M3, M4 are coupled in parallel. The fifth and sixth transistors M5, M6 are cross-coupled, with a gate of the fifth transistor M5 coupled to the bit line bar BLB and a gate of the sixth transistor M6 coupled to the bit line BL.

As used herein, two transistors are coupled "in series" if one of a source or a drain of one transistor is coupled to one of a source or a drain of the other transistor to enable a current, when both transistors are in the open or enabled state, to flow serially through the transistors. Particularly, when the transistors are of the same type, the source of one transistor is coupled to the drain of the other transistor. More particularly, in some embodiments where the first through sixth transistors M1-M6 are NMOS transistors, the first and fifth transistors M1, M5 are coupled in series by coupling the source of the first transistor M1 to the drain of the fifth transistor M5. Similarly, the third and sixth transistors M3, M6 are coupled in series by coupling the source of the third transistor M3 to the drain of the sixth transistor M6.

As used herein, two transistors are coupled "in parallel" if each of a source and a drain of one transistor is coupled to a corresponding one of a source and a drain of the other transistor to enable currents, when both transistors are in the open or enabled state, to flow in parallel through the transistors. Particularly, when the transistors are of the same type, the sources of the transistors are coupled together and the drains of the transistors are coupled together. More particularly, in some embodiments where the first through sixth transistors M1-M6 are NMOS transistors, the first and second transistors M1, M2 are coupled in parallel by coupling the source of the first transistor M1 to the source of the second transistor M2, and the drain of the first transistor M1 to the drain of the second transistor M2. Similarly, the third and fourth transistors M3, M4 are coupled in parallel by coupling the source of the third transistor M3 to the source of the fourth transistor M4, and the drain of the third transistor M3 to the drain of the fourth transistor M4.

The fifth transistor M5 and sixth transistor M6 are commonly coupled to an intermediate node 420. The read assist device 400 further includes a seventh transistor M7 coupling the intermediate node 420 to the node 220 of the predetermined voltage Vp. Thus, the seventh transistor M7 commonly couples the fifth and sixth transistors M5, M6 to the node 220. The read assist device 400 also includes an eighth transistor M8 coupled in parallel to the seventh transistor M7. In some embodiments where the first through eighth transistors M1-M8 are NMOS transistors, the sources of the cross-coupled fifth transistor M5 and sixth transistor M6 are commonly coupled via the intermediate node 420 to the drains of the seventh transistor M7 and the eighth transistor M8.

The first through fourth transistors M1-M4 perform the functions of the corresponding first through fourth circuits 216, 226, 236, 246 of the read assist device 206 in the memory 200B and/or the functions of the corresponding first through fourth switches 316, 326, 336, 346 of the read assist device 300. The cross-coupled fifth transistor M5 and sixth transistor M6 define an enabling circuit for selectively enabling the first and second transistors M1, M2 or the third and fourth transistors M3, M4 depending on a datum (e.g., a logical "0" or a logical "1") being read out from a memory cell coupled to the pair of bit lines BL/BLB. The seventh transistor M7 and eighth transistor M8 perform the functions of the corresponding first current source 370 and second current source 380 in the read assist device 300.

In some embodiments, one of the seventh transistor M7 or eighth transistor M8 is omitted. The read assist device 400 functions similarly to the read assist device 300 when one of the first current source 370 or second current source 380 is omitted.

Figure 5:
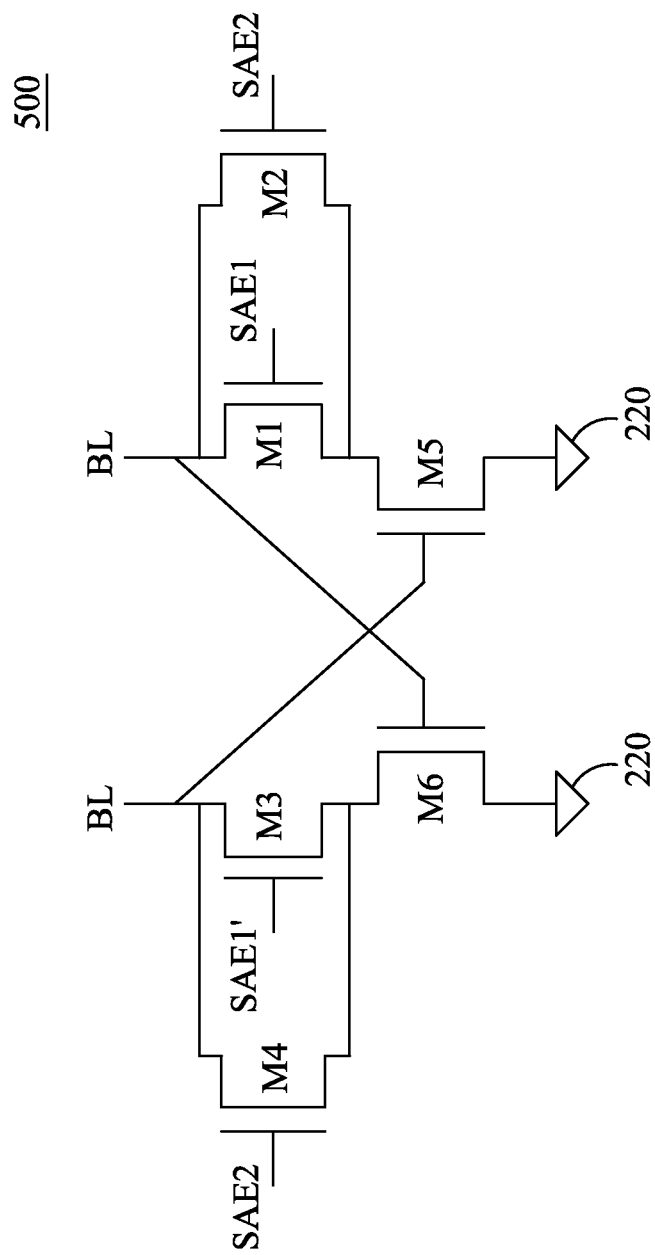
FIG. 5 is a schematic circuit diagram of a read assist device for a memory in accordance with some embodiments.

In some embodiments, for example, in a read assist device 500 for a memory in FIG. 5, both the seventh transistor M7 and eighth transistor M8 are omitted. The fifth transistor M5 and sixth transistor M6 are coupled to the node 220 of the predetermined voltage Vp. The read assist device 500 functions similarly to the read assist device 206 of the memory 200B.

Returning to FIG. 4, a control circuit, such as the control circuit 210, is coupled to the gates of the first through fourth, seventh and eighth transistors M1-M4, M7, M8 to enable the transistors. Specifically, the first and third transistors M1, M3 are enabled before the second and fourth transistors M2, M4. The first and third transistors M1, M3 are enabled by corresponding enabling signals SAE1 and SAE1'. The eighth transistor M8 is enabled simultaneously with the second and fourth transistors by an enabling signal SAE2. The seventh transistor M7 is enabled, by an enabling signal SEGD, before the first transistor M1. The first transistor M1 is enabled by the enabling signal SAE1 before the third transistor M1.

Figure 6A:
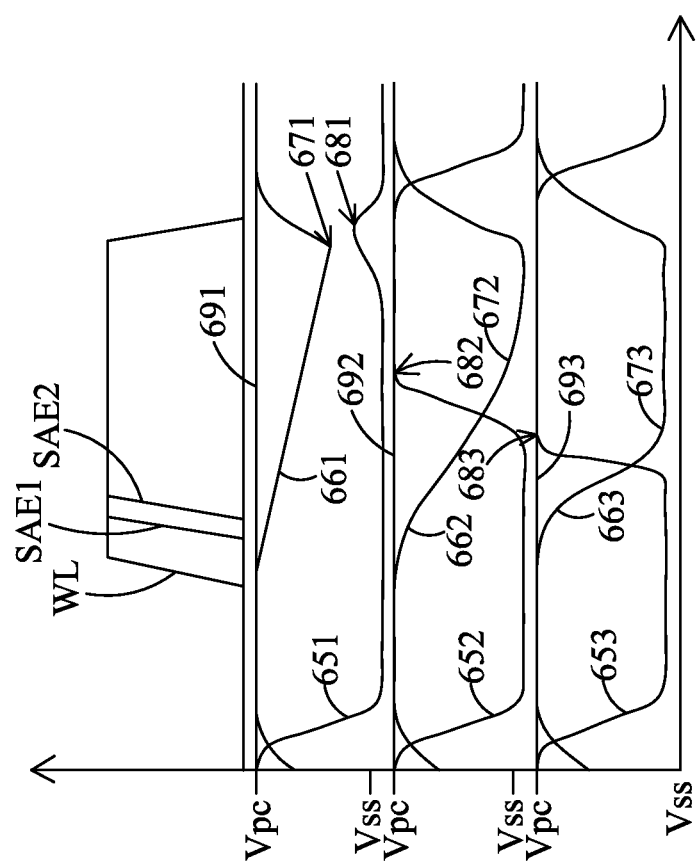
FIGS. 6A and 6B are various timing diagrams of voltages during operation of a memory in accordance with some embodiments.
Figure 6B:
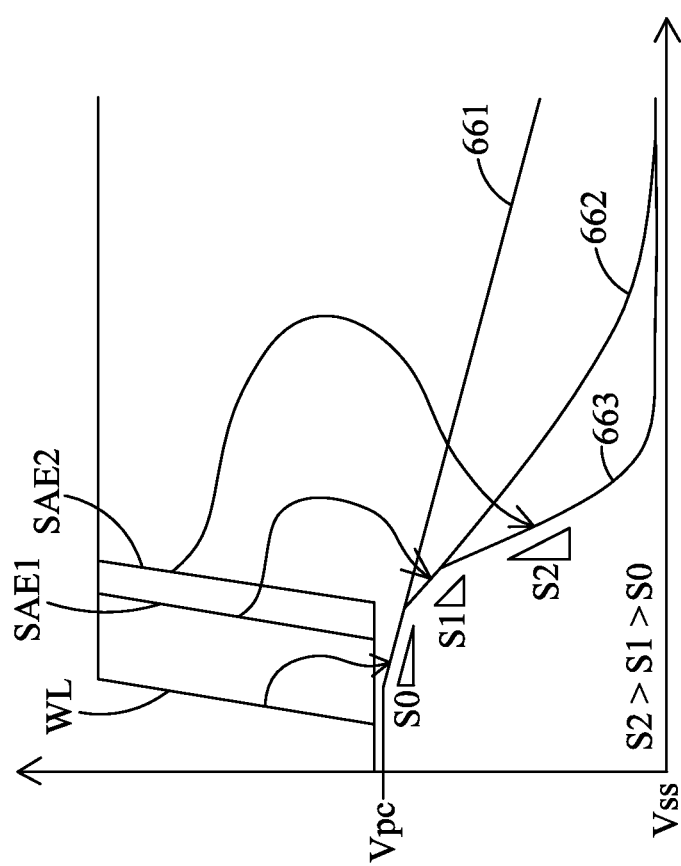

FIGS. 6A and 6B are various timing diagrams of voltages during operation of a memory having the read assist device 400 in accordance with some embodiments. Specifically, the operation of reading a logical "0" is described with respect to the bit line BL. The operation of reading a logical "1" is performed similarly with respect to the bit line bar BLB.

In some embodiments, the bit line BL and the bit line bar BLB are pre-charged to a pre-charge voltage Vpc.

Reference numerals 651, 661 and 691 in FIG. 6A indicate a voltage at the output of a sensing amplifier (e.g., the node BLPD in FIG. 1), the voltage on the bit line BL, and the voltage on the bit line bar BLB in the absence of a read assist device. When a memory cell is selected by an appropriate voltage WL on the corresponding word line to output a logical "0" contained in the memory cell, the voltage 661 on the bit line BL begins to transit from the pre-charge voltage Vpc toward the ground voltage VSS. Without a read assist device, the transition speed is slow under certain circumstances. With such a slow transition speed, at the end of the signal WL, the voltage 661 on the bit line BL reaches a level 671 which is insufficient for the sensing amplifier to output a correct reading of the datum (logical "0") being read. The voltage 651 at the output BLPD of the sensing amplifier indicates a failed read at 681.

Reference numerals 652, 662 and 692 in FIG. 6A indicate the voltage at the output of the sensing amplifier (e.g., the node BLPD in FIG. 1), the voltage on the bit line BL, and the voltage on the bit line bar BLB in a read assist device with a single stage. When a memory cell is selected by an appropriate voltage WL on the corresponding word line to output a logical "0" contained in the memory cell, the voltage 662 on the bit line BL begins to transit from the pre-charge voltage Vpc toward the ground voltage VSS. When the single stage of the read assist device is enabled by the enabling signal SAE1, the transition speed is faster than when no read assist device is used, i.e., the slope of the voltage 662 is higher than the slope of the voltage 661. With such a faster transition speed, at or near the end of the signal WL, the voltage 662 on the bit line BL reaches a level 672 which is sufficient for the sensing amplifier to output a correct reading of the datum (logical "0") being read. The voltage 652 at the output BLPD of the sensing amplifier indicates a successful read at 682.

Reference numerals 653, 663 and 693 in FIG. 6A indicate the voltage at the output of the sensing amplifier (e.g., the node BLPD in FIG. 1), the voltage on the bit line BL, and the voltage on the bit line bar BLB in a read assist device with a two stages in accordance with some embodiments. When a memory cell is selected by an appropriate voltage WL on the corresponding word line to output a logical "0" contained in the memory cell, the voltage 663 on the bit line BL begins to transit from the pre-charge voltage Vpc toward the ground voltage VSS. When the first stage of the read assist device is enabled by the enabling signal SAE1, a transition speed comparable to that of the voltage 662 is achieved. Afterwards, when the second stage of the read assist device is enabled by the enabling signal SAE2, the transition speed is further increased and becomes faster than when a read assist device with a single stage is used, i.e., the slope of the voltage 663 becomes higher than the slope of the voltage 662. With such an even faster transition speed, well before the end of the enabling signal SEGD, the voltage 663 on the bit line BL reaches a level 673 which is sufficient for the sensing amplifier to output a correct reading of the datum (logical "0") being read. The voltage 653 at the output BLPD of the sensing amplifier indicates a successful read at 683 which occurs earlier than the successful read 682 achieved by a read assist device with a single stage.

Thus, the dual-stage read assist device in accordance with some embodiments achieves a high successful read rate and at a fast access speed. Because a successful read is achievable at an early time, the durations of one or more of the signals WL, SAE1 and SAE2 are reduced in some embodiments to reduce power consumption.

A detailed explanation of how the voltage on the bit line BL transits during the reading operation of a logical "0" in the read assist device 400 is given with respect to FIG. 6B. In some embodiments, at the beginning of the reading operation, the bit line BL and the bit line bar BLB are pre-charged to a pre-charge voltage Vpc.

An enabling signal SEGD is applied to enable the seventh transistor M7 when a memory cell is selected by a signal WL to output the logical "0" stored in the memory cell on the bit line BL and the bit line bar BLB. The voltage on the bit line bar BLB is pulled high, e.g., toward the power supply voltage VDD and the voltage on the bit line BL begins its transition toward a predetermined voltage Vp, e.g., the ground voltage VSS, with a transition speed S0 comparable to that of the voltage 661 when no read assist device is used.

The high voltage on the bit line bar BLB is applied to the gate of the fifth transistor M5 and enables (i.e., opens) the fifth transistor M5. As the voltage on the bit line BL reduces the voltage on the gate of the sixth transistor M6 coupled to the bit line BL is also reduced and eventually disables (i.e., closes) the sixth transistor M6. With the closing of the sixth transistor M6, the voltage on the bit line bar BLB remains at the high voltage regardless of the states of the third transistor M3 and fourth transistor M4 in the subsequent stages.

At the beginning of the first stage, a first enabling signal SAE1, which corresponds to the first stage enabling signal ST1, is applied to the gate of the first transistor M1 to enable the first transistor M1. As a result, a first current path is established between the bit line BL and the node or ground 220 through the opened first transistor M1, fifth transistor M5 and seventh transistor M7. Such a first current path pulls the voltage on the bit line BL faster toward the ground, at a transition speed S1 higher than the transition speed S0 and comparable to that of the voltage 662.

At the beginning of the second stage, a second enabling signal SAE2, which corresponds to the second stage enabling signal ST2, is applied to the gate of the second transistor M2 to enable the second transistor M2. The second enabling signal SAE2 is also applied to the gate of the eighth transistor M8 to enable the eighth transistor M8. As a result, a second current path is established between the bit line BL and the node or ground 220 through the opened second transistor M2, fifth transistor M5 and eighth transistor M8. Such a second current path further pulls the voltage on the bit line BL even faster toward the ground, at a transition speed S2 higher than the transition speed S1.

The third transistor M3 is also enabled during the first stage but does not significantly affect the operation because the sixth transistor M6 is disabled. The fourth transistor M4 is also enabled during the second stage but does not significantly affect the operation because the sixth transistor M6 is disabled.

A similar operation of reading a logical "1" is performed with respect to the bit line bar BLB. Summarily, the first transistor M1, second transistor M2 and fifth transistor M5 are disabled, a third current path is established during the first stage via the opened third transistor M3, sixth transistor M6 and seventh transistor M7, and a fourth current path is established during the second stage via the opened fourth transistor M4, sixth transistor M6 and eighth transistor M8.

In some embodiments, during the first stage, the enabling signal SAE1' is applied to the third transistor M3 not earlier than the first enabling signal SAE1 applied to the first transistor M1. The reason is to prevent a logical "0" read disturbance which is possible if the sixth transistor M6 is not fully closed at the time the third transistor M3 is turned on by the enabling signal SAE1'.

In some embodiments, the first enabling signal SAE1 is applied to the first transistor M1 not earlier than the signal SEGD applied to the seventh transistor M7 (i.e., not earlier than the memory cell selection by a signal WL on the corresponding word line). The reason is to prevent a logical "1" read disturbance which is possible if the fifth transistor M5 is not fully closed at the time the seventh transistor M7 is turned on by the signal SEGD.

In some embodiments, during the second stage, two or more of the second transistor M2, fourth transistor M4 and eighth transistor M8 is/are enabled at a different timings. In some embodiments, more than two stages are provided in the read assist device. Such embodiments, while possible and within the scope of this disclosure, increase circuitry complexity and power consumption without a comparable gain in memory access speed. In some embodiments, the first and second stages are enabled at the same time, i.e., the first and second current paths (during a logical "0" reading) are established at the same time. Such embodiments, while possible and within the scope of this disclosure, may not necessarily increase the memory access speed in certain circumstances. The delays between the WL signal and the first enabling signal SAE1, and between the first enabling signal SAE1 and the second enabling signal SAE2 are tunable to best fit a particular memory configuration. In some embodiments, the delay between WL and SAE1 is from 4 gate delay to 10 gate delay depend on BL loading, and/or the delay between SAE1 and SAE2 is 1 transmission gate delay.

Figure 7:
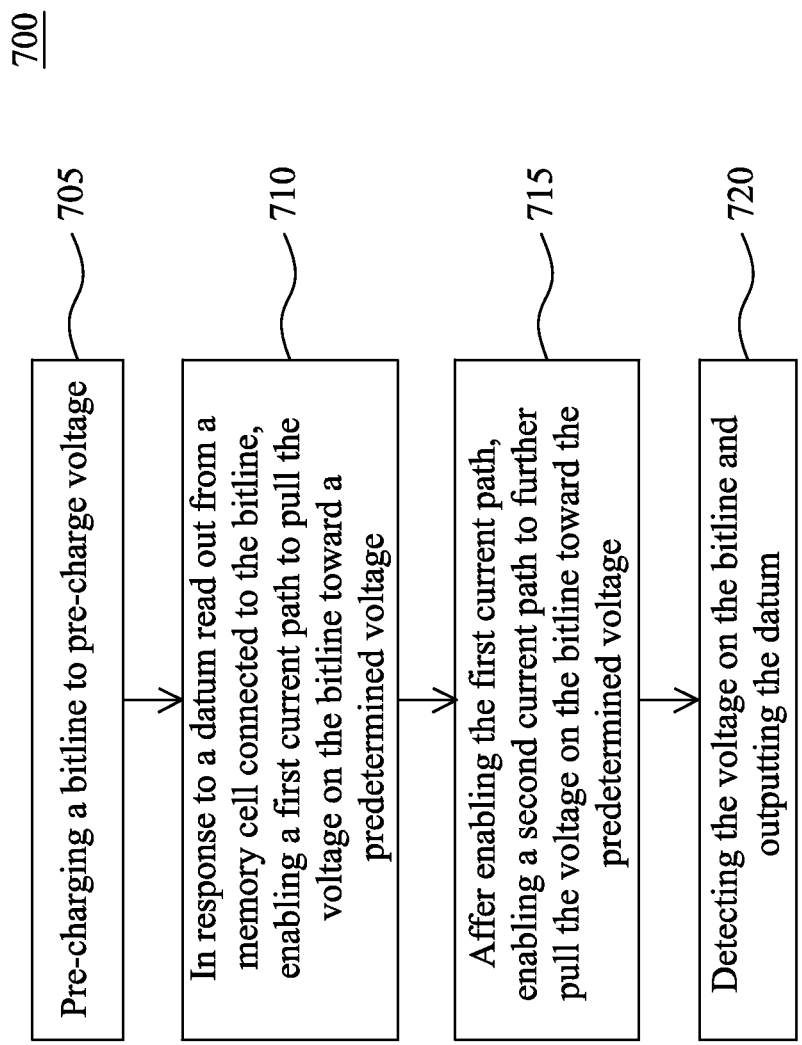
FIG. 7 is a flow chart of a method of operating a memory in accordance with some embodiments.

FIG. 7 is a flow chart of a method 700 of operating a memory in accordance with some embodiments. At step 705, a bit line, e.g., the bit line BL, is pre-charged to a pre-charge voltage Vpc. In some embodiments, this step is omitted.

At step 710, in response to a datum (e.g., a logical "0") being read out from a memory cell connected to the bit line BL, the pre-charge voltage Vpc on the bit line BL is caused to transit toward a ground voltage VSS with an initial transition speed (e.g., S0 in FIG. 6B). During a first stage of the transition, a first current path (e.g., the first current path I1) is established between the bit line BL and the ground to increase the transition speed (e.g., S1 in FIG. 6B).

At step 715, during a second, subsequent stage of the transition, a second current path (e.g., the second current path I2) is established in parallel with the first current path to further increase the speed of the transition (e.g., S2 in FIG. 6B).

At step 720, the voltage on the bit line BL reaches a sufficient level that permits a sensing amplifier (e.g., 110) to detect and output the datum read out from the memory cell.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

According to some embodiments, a memory comprises a first bit line, a memory cell coupled to the first bit line, and a read assist device coupled to the first bit line. The read assist device is configured to pull a first voltage on the first bit line toward a predetermined voltage in response to a first datum being read out from the memory cell. The read assist device comprises a first circuit configured to establish a first current path between the first bit line and a node of the predetermined voltage during a first stage. The read assist device further comprises a second circuit configured to establish a second current path between the first bit line and the node of the predetermined voltage during a second, subsequent stage.

According to some embodiments, a memory comprises a pair of bit lines including a first bit line and a second bit line, a memory cell coupled to the first and second bit lines, and first through sixth transistors. The first and fifth transistors are coupled in series between the first bit line and a node. The first and second transistors are coupled in parallel. The third and sixth transistors are coupled in series between the second bit line and the node. The third and fourth transistors are coupled in parallel. The fifth and sixth transistors are cross-coupled, with a gate of the fifth transistor coupled to the second bit line, and a gate of the sixth transistor coupled to the first bit line.

According to some embodiments, in a method of operating a memory, a bit line is pre-charged to a pre-charge voltage. In response to a datum being read out from a memory cell connected to the bit line, a transition of the pre-charge voltage on the bit line toward a ground voltage is caused. During a first stage of the transition, a first current path is established between the bit line and a ground to increase a speed of the transition. During a second, subsequent stage of the transition, a second current path is established in parallel with the first current path to further increase the speed of the transition.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A memory, comprising:
a first bit line;
a memory cell coupled to the first bit line; and
a read assist device coupled to the first bit line, the read assist device configured to pull a first voltage on the first bit line toward a predetermined voltage in response to a first datum being read out from the memory cell, the read assist device comprising:
a first circuit configured to cause a first current to flow along a first current path between the first bit line and a node of the predetermined voltage during a first stage, and
a second circuit configured to cause a second current to flow concurrently with the first current and along a second current path between the first bit line and the node of the predetermined voltage during a second, subsequent stage.

2. The memory of claim 1, wherein the first current path is parallel to the second current path.

3. The memory of claim 1, wherein the first circuit is configured to maintain the first current path during the second stage.

4. The memory of claim 1, further comprising:
a control circuit coupled to the first and second circuits, the control circuit configured to supply a first stage enabling signal to the first circuit during the first stage and to supply a second stage enabling signal to the second circuit during the second stage,
wherein the second stage enabling signal is a delayed signal of the first stage enabling signal.

5. The memory of claim 1, further comprising:
a second bit line coupled to the memory cell and the read assist device, wherein
the read assist device is configured to pull a second voltage on the second bit line toward the predetermined voltage in response to a second datum being read out from the memory cell, the read assist device further comprising:
a third circuit configured to establish a third current path between the second bit line and the node of the predetermined voltage during the first stage, and
a fourth circuit configured to establish a fourth current path between the second bit line and the node of the predetermined voltage during the second stage.

6. The memory of claim 5, further comprising:
a first current source commonly coupling the first and third circuits to the node of the predetermined voltage, the first current source configured to be enabled during the first stage.

7. The memory of claim 6, wherein
the first current source further commonly couples the second and fourth circuits to the node of the predetermined voltage, and
the first current source is further configured to be enabled during the second stage.

8. The memory of claim 6, further comprising:
a second current source commonly coupling the second and fourth circuits to the node of the predetermined voltage, the second current source configured to be enabled during the second stage.

9. The memory of claim 8, wherein
the first current source is configured to be enabled during both the first and second stages.

10. A memory, comprising:
a pair of bit lines including a first bit line and a second bit line;
a memory cell coupled to the first and second bit lines; and
first through sixth transistors; wherein
the first and fifth transistors are coupled in series between the first bit line and a node;
the first and second transistors are coupled in parallel;
the third and sixth transistors are coupled in series between the second bit line and the node;
the third and fourth transistors are coupled in parallel; and
the fifth and sixth transistors are cross-coupled, with a gate of the fifth transistor coupled to the second bit line and a gate of the sixth transistor coupled to the first bit line.

11. The memory of claim 10, further comprising:
a seventh transistor commonly coupling the fifth and sixth transistors to the node.

12. The memory of claim 11, further comprising:
an eighth transistor coupled in parallel with the seventh transistor.

13. The memory of claim 12, wherein
the first through eighth transistors are all n-channel metal-oxide semiconductor (NMOS) transistors, and
sources of the fifth and sixth transistors are commonly connected to drains of the seventh and eighth transistors.

14. The memory of claim 12, further comprising:
a control circuit coupled to gates of the first through fourth, seventh and eighth transistors, the control circuit configured to enable the first and third transistors before the second and fourth transistors.

15. The memory of claim 14, wherein
the control circuit is configured to enable the eighth transistor simultaneously with the second and fourth transistors.

16. The memory of claim 15, wherein
the control circuit is configured to enable the seventh transistor before the first transistor and to enable the first transistor before the third transistor.

17. A method of operating a memory, the method comprising:
pre-charging a bit line to a pre-charge voltage;
in response to a datum being read out from a memory cell connected to the bit line, causing a transition of the pre-charge voltage on the bit line toward a ground voltage;
during a first stage of the transition, causing a first current to flow along a first current path between the bit line and a ground to increase a speed of the transition; and
during a second, subsequent stage of the transition, causing a second current to flow concurrently with the first current, the second current flowing along a second current path parallel with the first current path, to further increase the speed of the transition.

18. The method of claim 17, further comprising:
detecting a voltage on the bit line at an end of the transition to output the datum.

19. The method of claim 17, wherein:
during the first stage, the first current path is established by enabling a first circuit and a first current source which are coupled in series between the bit line and the ground,
during the second stage, the second current path is established by enabling a second circuit and a second current source which are coupled in series between the bit line and the ground, and
during the second stage, the first current path is maintained by continuing to enable the first circuit and the first current source.

20. The method of claim 19, wherein:
the first current source is enabled before the first circuit; and
the second current source is enabled simultaneously with the second circuit.

\* \* \* \* \*